United States Patent
Glovatsky et al.

(10) Patent No.: US 7,180,736 B2
(45) Date of Patent: Feb. 20, 2007

(54) MICROELECTRONIC PACKAGE WITHIN CYLINDRICAL HOUSING

(75) Inventors: Andrew Z. Glovatsky, Plymouth, MI (US); Vladimir Stoica, Farmington Hills, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 180 days.

(21) Appl. No.: 10/616,528

(22) Filed: Jul. 10, 2003

(65) Prior Publication Data

US 2005/0007736 A1    Jan. 13, 2005

(51) Int. Cl.
*H05K 7/20* (2006.01)
(52) U.S. Cl. .................................... 361/688
(58) Field of Classification Search ............... 361/600, 361/776, 760, 783, 688, 689, 748, 679, 752, 361/727, 730, 729, 749, 737, 789, 761, 736; 257/685, 686, 678; 438/121, 106
See application file for complete search history.

(56) References Cited

U.S. PATENT DOCUMENTS

| | | | |
|---|---|---|---|
| 3,434,014 A | | 3/1969 | Taynton |
| 3,596,139 A | * | 7/1971 | Walsh ..................... 174/52.3 |
| 3,755,891 A | | 9/1973 | Muckelroy et al. |
| 4,051,414 A | | 9/1977 | Will et al. |
| 4,399,488 A | | 8/1983 | Ruwe et al. |
| 4,400,858 A | * | 8/1983 | Goiffon et al. ............... 24/546 |
| 4,513,064 A | | 4/1985 | Marcus |
| 4,756,644 A | * | 7/1988 | Williams ................. 405/184.1 |
| 4,810,917 A | | 3/1989 | Kumar et al. |
| 4,833,568 A | | 5/1989 | Berhold |
| 4,858,068 A | * | 8/1989 | Bitller et al. ............... 361/679 |
| 5,105,337 A | * | 4/1992 | Bitller et al. ............... 361/722 |
| 5,121,188 A | * | 6/1992 | Patridge et al. ............. 257/680 |
| 5,204,806 A | * | 4/1993 | Sasaki et al. ............... 361/749 |
| 5,568,356 A | * | 10/1996 | Schwartz ..................... 361/679 |
| 5,586,004 A | * | 12/1996 | Green et al. ................. 361/699 |
| 5,621,617 A | * | 4/1997 | Goss et al. .................. 361/721 |
| 5,794,687 A | * | 8/1998 | Webster et al. ............. 165/121 |
| 5,857,974 A | * | 1/1999 | Eberle et al. ............... 600/462 |
| 5,884,000 A | * | 3/1999 | Cloud et al. ................. 385/135 |
| 6,137,171 A | * | 10/2000 | Joshi .......................... 257/723 |
| 6,346,000 B1 | * | 2/2002 | Orr ............................. 439/342 |

(Continued)

FOREIGN PATENT DOCUMENTS

FR    2 739 744    10/1995

(Continued)

*Primary Examiner*—Lynn Feild
*Assistant Examiner*—Ingrid Wright
(74) *Attorney, Agent, or Firm*—Brinks Hofer Gilson & Lione

(57) ABSTRACT

A microelectronic package comprises microelectronic assemblies and a housing having a cylindrical outer wall. The microelectronic assemblies include electronic components mounted on a substrate and are affixed to support surfaces of the inner wall of the housing. The housing is preferably formed of semi-cylindrical sections that are joined along axial edges. The housing includes one or more axial channels interposed between the outer wall and the inner wall for conveying coolant gas. In this manner, the housing provides more uniform thermal dissipati9on of heat generated by the microelectronic assemblies during operation, despite variations in the thickness between the cylindrical outer wall and the support surfaces, which are preferably planar.

11 Claims, 1 Drawing Sheet

U.S. PATENT DOCUMENTS

| | | | |
|---|---|---|---|
| 6,404,636 B1 * | 6/2002 | Staggers et al. | 361/704 |
| 6,404,637 B2 * | 6/2002 | Hutchison et al. | 361/704 |
| 6,501,653 B1 * | 12/2002 | Landsgestell et al. | 361/699 |
| 6,665,182 B2 * | 12/2003 | Hogerl | 361/695 |
| 6,735,086 B1 * | 5/2004 | Weber et al. | 361/719 |
| 6,778,389 B1 | 8/2004 | Glovatsky et al. | |
| 6,865,085 B1 * | 3/2005 | Ferris et al. | 361/721 |
| 6,880,335 B2 * | 4/2005 | O'Baid et al. | 60/517 |
| 7,030,486 B1 * | 4/2006 | Marshall | 257/712 |
| 2003/0185689 A1 * | 10/2003 | Wang | 417/356 |

FOREIGN PATENT DOCUMENTS

| | | |
|---|---|---|
| WO | WO 01/13692 A1 * | 8/1999 |
| WO | WO 01/13692 A1 | 2/2001 |

* cited by examiner

MICROELECTRONIC PACKAGE WITHIN CYLINDRICAL HOUSING

TECHNICAL FIELD OF THE INVENTION

This invention relates to a microelectronic package that includes a microelectronic assembly within a cylindrical housing. More particularly, this invention relates to such microelectronic package wherein the microelectronic assembly is affixed to a planar surface and further wherein the cylindrical housing includes internal coolant passages for dissipating heat generated by the microelectronic assembly during operation.

BACKGROUND OF THE INVENTION

The microelectronic assembly comprises electronic components mounted on a substrate and interconnected by metallic traces. A suitable substrate comprises a flexible membrane. The substrate is maintained planar during processing to define the traces and attach the electronic components. The assembly is then attached to a rigid support to prevent the bending during use, which might otherwise damage the electronic components or the electrical connections. During use, the electronic components generate heat, which must be dissipated to maintain the microelectronic assembly within the desired operating temperature range.

The shape of the package that contains the microelectronic assembly is largely dependant upon the nature of the product. In some instances, it is desired to incorporate the microelectronic assembly within a cylindrical housing. For example, a cylindrical housing is desired for packaging electronics within a military missile. Within the package, it is convenient to support the microelectronic assembly on an inner surface of the housing. Moreover, it is desired that the support surface be planar to avoid disturbing the electronic components and electrical connections. In designing a housing that comprises a planar inner wall and a cylindrical outer wall, variations occur in the thickness of the housing, such that the housing tends to be thicker adjacent central regions of the microelectronic assembly whereat the electronic components tend to generate greater heat. As a result, the microelectronic assembly experiences non-uniform temperature that may adversely affect operation of the electronic circuit.

Therefore, a need exists for an improved microelectronic package that comprises a housing that includes a planar inner surface for supporting a microelectronic assembly and a cylindrical outer wall to satisfy products spacial requirements, which housing provides for enhanced thermal dissipation of heat generated by electronic components during operation.

SUMMARY OF THE INVENTION

In accordance with this invention, a microelectronic package comprises a housing having an outer wall cylindrical about an axis and an inner wall defining a central compartment. A microelectronic assembly is affixed to an assembly support surface of the inner wall. Preferably, the support is planar and parallel to the axis, or has a radius of curvature non-concentric with the outer wall. Further, the housing includes one or more axial channels interposed between the outer wall and the inner wall. Thus, the package comprises an outer wall that is cylindrical to conform to special requirements of the product and an inner wall that provides a planar or other desired contour for support of the microelectronic assembly. It is an advantage that the channels reduce the mass of the housing and also convey coolant gas flow during use, thereby providing more uniform thermal dissipation to maintain regions of the microelectronic assembly within the desired operating temperature.

BRIEF DESCRIPTION OF THE DRAWINGS

This invention will be further illustrated with reference to the accompanying drawings wherein.

DETAILED DESCRIPTION OF THE INVENTION

Figure 1:
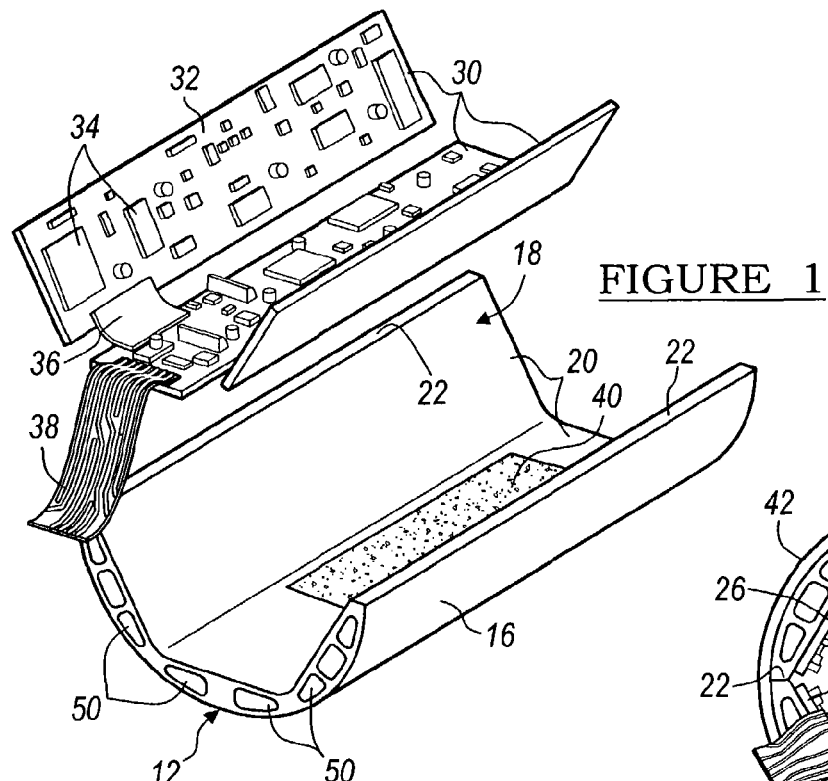
FIG. 1 is an exploded perspective view of a section of a microelectronic package in accordance with this invention.
Figure 3:
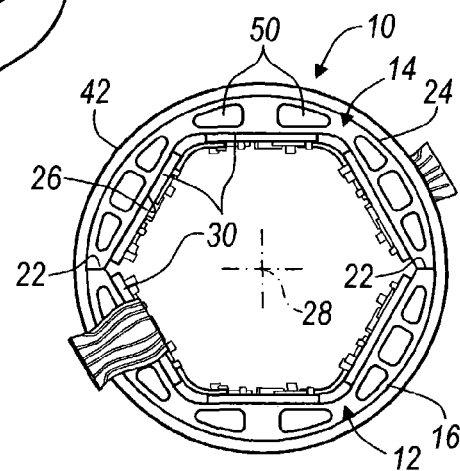
FIG. 3 is an end view of a microelectronic package formed from sections in FIG. 2 in accordance with this invention.
Figure 2:
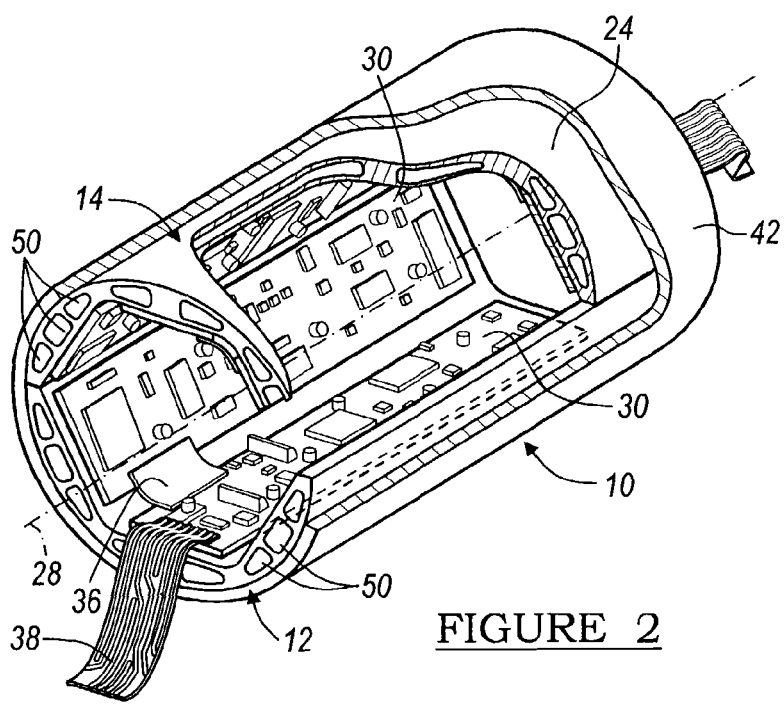
FIG. 2 is a perspective view showing a section of a microelectronic package in accordance with this invention.

In accordance with the preferred embodiment of this invention, referring to FIGS. 1 through 3, a microelectronic package 10 comprises a cylindrical housing formed of two sections 12 and 14. Referring to FIG. 1, section 12 is formed of metal and comprises a semi-cylindrical outer wall 16, an inner wall 18 that includes planar assembly support surfaces 20, and edges 22. Section 14 is identical to section 12 and includes a semi-cylindrical outer wall 24 and an inner wall formed of planar support surfaces 26. Sections 12 and 14 are preferably formed of an extrusion or casting of an aluminum alloy, steel, copper alloy, titanium alloy or other suitable metal. Alternatively, the sections may be formed of polymeric composite material, such as an epoxy composite containing carbon fiber filler. To form package 10, sections 12 and 14 are joined at the edges, such that outer wall 16 of section 12 cooperates with outer wall 24 of section 14 to define an outer wall for package 10 that is cylindrical about axis 28. Support surfaces 20 cooperate to form an inner wall for package 10 that is hexagonal about axis 28. While in this embodiment the inner wall is hexagonal, the inner wall may be square, rectangular or any other suitable polygonal shape. Also, the support surfaces may have a non-planar cross section perpendicular to axis 28. In an alternate example, the surfaces may be curved and have a radius of curvature less than the radius of the outer walls 16 and 18, such that the support is thinner at the mid section of the assembly and thicker near the axial edges.

Microelectronic assemblies 30 are attached to assembly support surfaces 20 and 26. Each assembly comprises a substrate 32 onto which are mounted electronic components 24 which are interconnected by metallic traces (not shown). Substrates 32 are preferably flexible membranes, although this invention is suitable for use with rigid boards. Circuits on adjacent assemblies 30 are interconnected by flexible interconnects 36. Flexible connections 38 are also provided for connecting the microelectronic assemblies 30 to power sources or other electronic elements during use.

To manufacture package 10, microelectronic assemblies 30 are manufactured to define the metallic traces on substrates 32 and attach electronic components 34 thereto. Substrate 32 is preferably maintained planar during the processing. Flexible interconnects 36 are attached to interconnect circuits on adjacent assemblies. Assemblies 30 are then affixed to support surfaces 20 and 26 using thermally conductive adhesive 40. Alternatively, the assemblies may be attached by mechanical fasteners. Following attachment of assemblies 30, sections 12 and 14 are arranged, and edges 22 joined to form package 10.

By way of a preferred example, package 10 comprises electrical circuits for operating a missile. In this example, package 10 is adapted to be axially inserted into a cylindrical casing 42 for the missile.

It is a feature of this invention that sections 12 and 14 comprise a plurality of axial passages 50 interposed between support surfaces 20 and 26 and outer walls 16 and 24. In this embodiment, it is desired that assemblies 30 be supported in a planar orientation consistent with the orientation during manufacture, in order to avoid damage to the electronic components 34 and their electrical connections to the metal traces. This results in non-concentric geometries between the inner wall and the outer wall of the package. Referring to FIG. 3, it is seen that each support surface includes a central region that is spaced apart from the outer wall by a distance greater than at the bend lines between support surfaces. During operation, heat generated by the electronic components 34 is absorbed by sections 12 and 14. Coolant gas is flowed through channels 50 and absorbs heat from the surrounding metal section. The flow of coolant gas reduces heat buildup within the sections and thus maintains a more uniform temperature across the microelectronic assemblies.

Therefore, this invention provides a microelectronic assembly 10 that comprises an outer wall that is cylindrical and an inner wall that includes support surfaces that are planar. The planar support surfaces allow the microelectronic assemblies to be maintained in a planar orientation consistent with processing operations to manufacture the microelectronic assemblies. In addition, the package of this invention includes axial channels for flow of coolant gas during operations. The channels, and the cooling gas flow, enhance thermal dissipation of heat generated during use of the microelectronic assemblies and thus maintain the assemblies within a desired temperature range. It is a further advantage that the channels reduce the mass of metal and so produce a lightweight housing.

While this invention has been described in terms of certain embodiments thereof, it is not intended to be so limited, but rather only to the extent set forth in the claims that follow.

The invention claimed is:

1. A microelectronic package comprising:
a housing including a cylindrical wall defining a central axis, the cylindrical wall having an outer surface and an inner surface, said cylindrical wall defining a central compartment between the inner surface and the central axis, the central axis being located within the central compartment, said inner surface having at least one assembly support surface that substantially faces the central axis, said housing further including at least one axial channel interposed between the outer surface and the inner surface; and
a microelectronIc assembly affixed to the assembly support surface, thereby disposing the microelectronic assembly within the central compartment.

2. The microelectronic package of claim 1 wherein the inner surface is non-concentric with the outer surface.

3. The microelectronic package of claim 1 wherein the support surface is planar.

4. The microelectronic package of claim 1 wherein the inner surface comprises first and second assembly support surfaces that are planar, wherein the microelectronic package comprises a first microelectronic assembly affixed to the first assembly support surface, a second microelectronic assembly affixed to the second assembly support surface, and a flexible interconnect connecting the first microelectronic assembly and the second microelectronic assembly.

5. The microelectronic package of claim 1 wherein the channel is adapted for conveying cooling gas through the housing.

6. The microelectronic package of claim 1 wherein the housing comprises a first section having first axial edges and a second section having second axial edges joined to the first axial edges.

7. The microelectronic package of claim 6 wherein the first section comprises a semi-cylindrical wall and wherein the second section comprises a semi-cylindrical wall.

8. The microelectronic package of claim 1 wherein the housing is formed by a metal extrusion.

9. The microelectronic package of claim 1 wherein the housing is formed of a metal casting.

10. The microelectronic package of claim 1 wherein the housing is received in a tubular casing.

11. The microelectronic package of claim 1 wherein the support surface is a curve having a radius of curvature less than the radius of the outer wall.

* * * * *

UNITED STATES PATENT AND TRADEMARK OFFICE
CERTIFICATE OF CORRECTION

PATENT NO. : 7,180,736 B2 Page 1 of 1
APPLICATION NO. : 10/616528
DATED : February 20, 2007
INVENTOR(S) : Andrew Z. Glovatsky et al.

It is certified that error appears in the above-identified patent and that said Letters Patent is hereby corrected as shown below:

On the Title Page

Item (57) under "ABSTRACT", after "more uniform thermal" delete "dissipati9on" and substitute --dissipation-- in its place.

Signed and Sealed this

First Day of May, 2007

JON W. DUDAS
*Director of the United States Patent and Trademark Office*